(12) United States Patent
Komatsu

(10) Patent No.: US 7,968,388 B2
(45) Date of Patent: Jun. 28, 2011

(54) THIN-FILM DEVICE, METHOD FOR MANUFACTURING THIN-FILM DEVICE, AND DISPLAY

(75) Inventor: Yuko Komatsu, Suwa (JP)

(73) Assignee: Seiko Epson Corporation (JP)

( * ) Notice: Subject to any disclaimer, the term of this patent is extended or adjusted under 35 U.S.C. 154(b) by 9 days.

(21) Appl. No.: 12/181,407

(22) Filed: Jul. 29, 2008

(65) Prior Publication Data

US 2009/0057681 A1 Mar. 5, 2009

(30) Foreign Application Priority Data

Aug. 31, 2007 (JP) ................. 2007-225320
Aug. 31, 2007 (JP) ................. 2007-225321
May 20, 2008 (JP) ................. 2008-131650

(51) Int. Cl.
*H01L 21/00* (2006.01)

(52) U.S. Cl. ........ 438/158; 438/149; 438/151; 438/155; 257/71; 257/72; 257/E29.117; 257/E29.151; 257/E29.273; 257/E27.112; 257/E21.094; 257/E21.104; 257/E21.411; 257/E21.414

(58) Field of Classification Search ............ 257/71, 257/59, 72; 438/149, 151, 155, 158
See application file for complete search history.

(56) References Cited

U.S. PATENT DOCUMENTS

| 2003/0040164 | A1* | 2/2003 | Inoue et al. | 438/438 |
| 2006/0138428 | A1* | 6/2006 | Ahn et al. | 257/72 |
| 2006/0202202 | A1* | 9/2006 | Denda et al. | 257/59 |
| 2009/0032819 | A1* | 2/2009 | Lim et al. | 257/72 |

FOREIGN PATENT DOCUMENTS

| JP | 10-125931 | 5/1998 |
| JP | 2001-125138 | 5/2001 |
| JP | 2007-288078 | 11/2007 |
| JP | 2007-288080 | 11/2007 |

* cited by examiner

*Primary Examiner* — Benjamin P Sandvik
*Assistant Examiner* — Farid Khan
(74) *Attorney, Agent, or Firm* — Harness, Dickey & Pierce, P.L.C.

(57) ABSTRACT

A method for manufacturing a thin-film device includes forming a separation layer on a substrate, forming a base insulating layer on the separation layer, forming a thin-film device layer on the base insulating layer, bonding a transfer layer including the base insulating layer and the thin-film device layer to a transfer body with an adhesive, causing intralayer delamination or interfacial delamination in the separation layer, and removing the transfer layer from the substrate. The thin-film device layer includes a first wiring sublayer which is located at the bottom of the thin-film device layer and which is in contact with the base insulating layer, a dielectric sublayer which is in contact with a surface of the first wiring sublayer, a semiconductor sublayer electrically insulated from the first wiring sublayer with the dielectric sublayer, and a second wiring sublayer formed subsequently to the semiconductor sublayer. The first wiring sublayer includes electrodes located at the bottom of the thin-film device layer.

2 Claims, 15 Drawing Sheets

LIGHT

LASER BEAM

LASER BEAM

THIN-FILM DEVICE, METHOD FOR MANUFACTURING THIN-FILM DEVICE, AND DISPLAY

BACKGROUND

1. Technical Field

The present invention relates to a thin-film device, a method for manufacturing the thin-film device, and a display. In particular, the display is manufactured in such a manner that an active matrix driving circuit including thin-film devices is separated from a substrate, which is the original, and then transferred to a second substrate.

2. Related Art

Conventional thin-film devices for displays are formed on rigid substrates such as glass substrates. If such thin-film devices are formed on lightweight plastic substrates, advantages such as weight reduction, thickness reduction, and shatter prevention can be achieved.

JP-A-10-125931 (hereinafter referred to as Patent Document 1) discloses a technique for transferring thin-film devices fabricated on a first substrate, which is the original, to a second substrate in one step. If the technique is used to manufacture a display, pixel electrodes and external connection terminals need to extend to a peel-off surface.

Patent Document 1 provides a structure in which pixel electrodes 1700 extend through an interlayer insulating layer to a separation layer 3100 and an electrode made of indium tin oxide (ITO) or aluminum extends to a peel-off surface. In such a structure, circuit components such as transistors and storage capacitors cannot be arranged in a region containing the pixel electrodes 1700.

Active matrix-type electrophoretic and liquid crystal displays include pixel circuits, which usually include selection transistors for selecting pixels and storage capacitors for holding the potential of pixel electrodes. In particular, the storage capacitors preferably have high capacity because components of the electrophoretic displays have a long response time of, for example, several hundred milliseconds. In the electrophoretic and liquid crystal displays, no circuit components can be arranged in regions containing the pixel electrodes; hence, it is difficult to allow the storage capacitors to have high capacity. In order to allow the storage capacitors to have high capacity, the pixel electrodes need to have a small size. This leads to a reduction in aperture ratio. Therefore, there is a problem in that the electrophoretic and liquid crystal displays suffer from low contrast. Furthermore, there is a problem in that an increase in definition leads to a reduction in aperture ratio at the same storage capacitance. The term "aperture ratio" used herein means the percentage of a pixel electrode in one pixel, that is, the area percentage of a pixel electrode, serving for display, in each pixel.

In order to solve the above problems, the following technique has been proposed as disclosed in JP-A-2001-125138 (hereinafter referred to as Patent Document 2): a technique for forming the same structure as that present on a first substrate, which is the original, on a third substrate through two transfer steps. According to this technique, the same surface structure as that of the first substrate is obtained on the third substrate and therefore driving circuits can be formed on a plastic substrate by the same process as that for fabricating ordinary thin-film transistors. That is, unlike a process for transferring a thin-film device in one step, pixel electrodes need not extend to a peel-off surface; hence, circuit components can be fabricated in a region containing the pixel electrodes so as to be located at a level different from a level at which the pixel electrodes are arranged. This provides sufficient storage capacitance without causing a reduction in aperture ratio.

However, this technique includes the two transfer steps and therefore is complicated. This technique has problems such as high cost and low yield. Therefore, the following process has been demanded: a low-cost process for manufacturing a thin-film device, having substantially the same circuit function as that of a thin-film device manufactured through two transfer steps, in one transfer step.

SUMMARY

An advantage of an aspect of the invention is to provide a thin-film device effective in securing a high aperture ratio and high storage capacitance. An advantage of another aspect of the invention is to provide a method for manufacturing such a thin-film device.

An advantage of another aspect of the invention is to provide a flexible display which can be manufactured at low cost and high yield and which has high definition, resolution, and performance. In particular, this advantage is to provide a pixel circuit which can be transferred to a plastic substrate in one step and which is effective in securing a high aperture ratio and high storage capacitance.

A method for manufacturing a thin-film device according to the present invention includes forming a separation layer on a substrate, forming a base insulating layer on the separation layer, forming a thin-film device layer on the base insulating layer, bonding a transfer layer including the base insulating layer and the thin-film device layer to a transfer body with an adhesive, causing intralayer delamination or interfacial delamination in the separation layer, and removing the transfer layer from the substrate. The thin-film device layer includes a first wiring sublayer which is located at the bottom of the thin-film device layer and which is in contact with the base insulating layer, a dielectric sublayer which is in contact with a surface of the first wiring sublayer, a semiconductor sublayer electrically insulated from the first wiring sublayer with the dielectric sublayer, and a second wiring sublayer formed subsequently to the semiconductor sublayer. The first wiring sublayer includes electrodes located at the bottom of the thin-film device layer.

The electrodes are preferably pixel electrodes. The second wiring sublayer preferably includes capacitor electrodes, the capacitor electrodes are opposed to the pixel electrodes with the dielectric sublayer disposed therebetween. The whole or a portion of each pixel electrode and the whole or a portion of each capacitor electrode preferably form a capacitor.

The thin-film device layer preferably includes thin-film transistors each including a gate electrode that is a portion of the first wiring sublayer, a gate insulating zone that is a portion of the dielectric sublayer, a portion of the semiconductor sublayer, and a source electrode and drain electrode that are portions of the second wiring sublayer. The thin-film transistors preferably have an inverted staggered structure in which the gate electrode, the gate insulating zone, the semiconductor sublayer, and the source and drain electrodes are arranged in that order.

According to the above method, the pixel electrodes can be formed from the first and second wiring sublayers, which are used to form the thin-film transistor, and therefore no wiring layer need to be formed in order to form the pixel electrodes. This leads to a reduction in manufacturing cost.

A thin-film device according to the present invention is manufactured by the above method. The gate electrodes have a width less than or equal to one tenth of that of the pixel electrodes.

A display according to the present invention includes a thin-film device manufactured by the method and a display device layer located on the first wiring sublayer side of the thin-film device. The display device layer includes an electrophoretic sublayer, a common electrode, and a counter substrate arranged in that order from the first wiring sublayer side.

In the display, the pixel electrodes are in contact with the display device layer; hence, current-driven display devices can be used.

The base insulating layer has a function of reducing the leakage currents flowing between the pixel electrodes and the display devices. In order to reduce the leakage currents flowing therebetween, a passivation layer is usually formed after the pixel electrodes are formed. According to the present invention, the base insulating layer is used to reduce the leakage currents flowing therebetween instead of the passivation layer. The base insulating layer is formed together with the thin-film devices; hence, the leakage currents can be reduced without requiring a step of forming the passivation layer.

The capacitors formed between the pixel and capacitor electrodes are preferably used as storage capacitors for holding the voltages of the pixel electrodes.

If each pixel circuit for use in an active matrix display has such a configuration, the area of each pixel can be effectively used to form the pixel circuit because a pixel electrode is used as one of electrodes of a storage capacitor.

The base insulating layer preferably has a thickness less than or equal to one tenth of that of the electrophoretic sublayer.

A method for manufacturing a thin-film device according to the present invention includes forming a separation layer on a substrate, forming a base insulating layer on the separation layer, forming a thin-film device layer on the base insulating layer, bonding a transfer layer including the base insulating layer and the thin-film device layer to a transfer body with an adhesive, causing intralayer delamination or interfacial delamination in the separation layer, and removing the transfer layer from the substrate. The thin-film device layer is formed in such a manner that a semiconductor sublayer is formed on the base insulating layer, an insulating sublayer is formed on the semiconductor sublayer, and a wiring sublayer is formed on the insulating sublayer. Electrodes formed from the semiconductor sublayer are arranged along the base insulating layer.

The thin-film device layer preferably includes top gate-type thin-film transistor each including a source region and drain region arranged in the semiconductor sublayer, a gate insulating sublayer that is a portion of the insulating sublayer, and a gate electrode disposed in the wiring sublayer. The electrodes are preferably pixel electrodes connected to the drain regions.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the present invention will now be described.

First Embodiment

A method for transferring a thin-film device according to a first embodiment of the present invention will now be described with reference to FIGS. 1 to 8.

Figure 1:
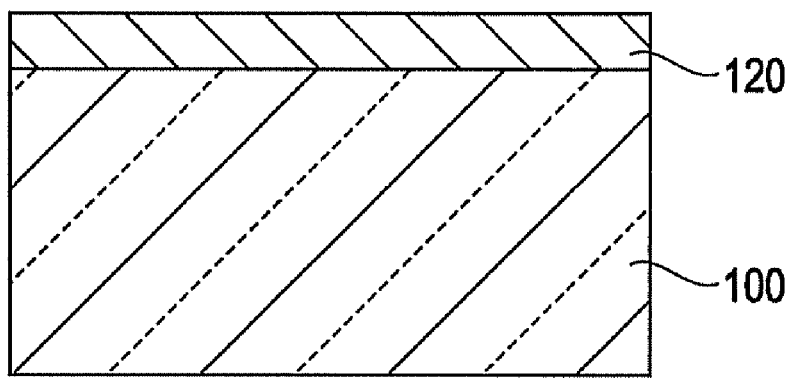
FIG. 1 is a sectional view showing a step of forming a separation layer on a substrate.

As shown in FIG. 1, a separation layer 120 is formed on a substrate 100. The substrate 100 and the separation layer 120 are described below in detail.

(1) Description of Substrate 100

The substrate 100 preferably allows light to pass therethrough, that is, the substrate 100 is preferably light-transmissive. The substrate 100 preferably has a transmittance of 10% or more and more preferably 50% or more. When the transmittance of the substrate 100 is excessively low, the loss of light is large; hence, a large amount of light is necessary to separate the separation layer 120 from the substrate 100.

Figure 2:
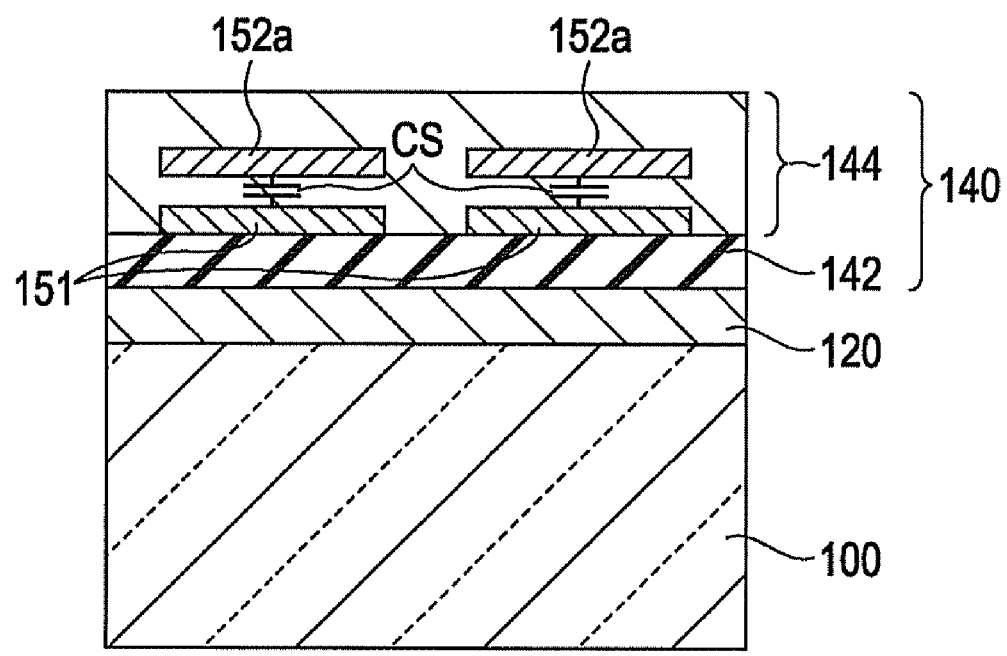
FIG. 2 is a sectional view showing a step of forming a transfer layer on the separation layer.

The substrate 100 is preferably made of a highly reliable material and more preferably a heat-resistant material. This is because the formation temperature of a transfer layer 140, described below, including a base insulating sublayer 142 shown in FIG. 2 is high, for example, about 350° C. to 1000° C. depending on the type of the transfer layer 140 and/or a process for forming the transfer layer 140 and therefore conditions, such as temperature conditions, for forming the transfer layer 140 above the substrate 100 can be widely varied when the substrate 100 is heat-resistant.

Therefore, the substrate 100 is preferably made of a material with a strain point higher than equal to Tmax that represents the maximum temperature during the formation of the transfer layer 140. In particular, the substrate 100 is preferably made of a material with a strain point of 350° C. or more and more preferably 500° C. or more. Examples of such a material include quartz glass, Corning 7059 glass, and heat-resistant glass such as OA-2 available from Nippon Electric Glass Co., Ltd.

The thickness of the substrate 100 is not particularly limited and is preferably about 0.1 to 5.0 mm and more preferably about 0.5 to 1.5 mm. When the substrate 100 has extremely small thickness, the substrate 100 has low strength. When the substrate 100 has an extremely large thickness, the loss of the light passing therethrough is large if the transmittance of the substrate 100 is low. If the transmittance of the substrate 100 is high, the substrate 100 may have a thickness greater than about 5.0 mm. In order to uniformly irradiate the separation layer 120 with light, the thickness of the substrate 100 is preferably uniform.

(2) Description of Separation Layer 120

The separation layer 120 absorbs light to cause delamination therein or at the interface between the separation layer 120 and the substrate 100. This phenomenon is hereinafter referred to as "intralayer delamination" or "interfacial delamination". The interatomic or intermolecular forces in a material for forming the separation layer 120 is preferably lost or reduced by light irradiation, that is, ablation is preferably caused in the separation layer 120 by light irradiation such that intralayer delamination and/or interfacial delamination occurs.

The separation layer 120 may be separated from the substrate 100 in such a manner that gas is discharged from the separation layer 120 by light irradiation. That is, a component contained in the separation layer 120 is vaporized into gas or a portion of the separation layer 120 is momentarily converted into gas by the absorption of light, so that the gas generated from the component or the separation layer 120 is discharged from the separation layer 120. Examples of a material for forming the separation layer 120 include those described in Items A to F below.

A. Amorphous Silicon (a-Si)

Amorphous silicon used may contain hydrogen (H). The content of hydrogen therein is preferably about 2 atomic percent or more and more preferably about 2 to 20 atomic percent. When the separation layer 120 is made of amorphous silicon containing such an amount of hydrogen, the hydrogen therein is released by light irradiation to increase the pressure in the separation layer 120. The increased pressure therein acts as the force to separate the separation layer 120 from the substrate 100. The content of hydrogen in the amorphous silicon can be adjusted by varying deposition conditions, for example, chemical vapor deposition (CVD) conditions such as the composition of a gas mixture used, the temperature of the substrate 100, the input power, the pressure, type, flow rate, and/or temperature of each gas used.

B. Dielectric Materials (Ferroelectric Materials), Semiconductor Materials, and Oxide Ceramic Materials such as Silicon Oxides, Silicates, Titanium Oxides, Titanates, Zirconium Oxides, Zirconates, Lanthanum Oxides, and Lanthanates Examples of silicon oxides usable herein include SiO, $SiO_2$, and $Si_3O_3$. Examples of silicates usable herein include $K_2SiO_3$, $Li_2SiO_3$, $CaSiO_3$, $ZrSiO_4$, and $Na_2SiO_3$. Examples of titanium oxides usable herein include TiO, $Ti_2O_3$, and $TiO_3$. Examples of titanates usable herein include $BaTiO_4$, $BaTiO_3$, $Ba_2Ti_9O_{20}$, $BaTi_5O_{11}$, $CaTiO_3$, $SrTiO_3$, $PbTiO_3$, $MgTiO_3$, $ZrTiO_2$, $SnTiO_4$, $Al_2TiO_5$, and $FeTiO_3$. An example of zirconium oxides usable herein is $ZrO_2$. Examples of zirconates usable herein include $BaZrO_3$, $SiZrO_4$, $PbZrO_3$, $MgZrO_3$, and $K_2ZrO_3$.

C. Dielectric Materials (Ferroelectric Materials) and Ceramic Materials such as Lead Zirconate Titanate (PZT), Lead Lanthanum Zirconate Titanate (PLZT), PLLZT, and Lead Barium Zirconate Titanate (PBZT).

D. Nitride Ceramic Materials such as Silicon Nitride, Aluminum Nitride, and Titanium Nitride E. Organic Polymeric Materials Organic polymeric materials usable herein are not particularly limited and preferably have a large number of bonds, cleaved by light irradiation, such as methylene (—CH—) bonds, ketone (—CO—) bonds, amide (—CONH—) bonds, imide (—NH—) bonds, ester (—COO—) bonds, azo (—N=N—) bonds, and cif (—CH=N—) bonds. The organic polymeric materials may contain one or more aromatic groups (one or more phenyl or condensed aromatic groups). Examples of the organic polymeric materials include polyolefins such as polyethylenes and polypropylenes, polyimides, polyamides, polyesters, polymethylmethacrylates (PMMAs), polyphenylene sulfides (PPSs), polyether sulfones (PESs), and epoxy resins.

F. Metal Materials

Examples of metal materials usable herein include Al, Li, Ti, Mn, In, Sn, Y, La, Ce, Nd, Pr, Gd, Sm, and alloys containing at least one of these metals.

The thickness of the separation layer 120 depends on the purpose of separation, the composition of the separation layer 120, the configuration of the separation layer 120, and a process for forming the separation layer 120 and is preferably about 1 nm to 20 μm, more preferably about 10 nm to 2 μm, and further more preferably about 40 nm to 1 μm. When the thickness thereof is extremely small, the separation layer 120 cannot be maintained uniform and therefore may be nonuniformly separated from the substrate 100. When the thickness thereof is extremely large, the power (amount) of the light applied to the substrate 100 needs to be large in order to appropriately separate the separation layer 120 from the substrate 100 and the removal of the separation layer 120 takes a long time. The thickness of the separation layer 120 is preferably uniform.

A process for forming the separation layer 120 is not particularly limited and may be selected depending on the composition, thickness, and other conditions of the separation layer 120. Examples of such a process include vapor deposition processes such as CVD including metal-organic chemical vapor deposition (MOCVD), low-pressure chemical vapor deposition (LPCVD), and electron cyclotron resonance chemical vapor deposition (ECR-CVD), vapor deposition, molecular beam (MB) vapor deposition, ring, ion plating, and physical vapor deposition (PVD); plating processes such as electroplating, dipping, and electroless plating; the Langmuir-Blodgett process; coating processes such as spin coating, spray coating, and roll coating; printing processes; transfer processes; ink jet processes; and powder jet processes. These processes may be used in combination.

In the case where amorphous silicon is used to form the separation layer 120, the separation layer 120 is preferably formed by CVD and more preferably LPCVD or ECR-CVD.

In the case where a ceramic material produced by a sol-gel process or an organic polymeric material is used to form the separation layer 120, the separation layer 120 is preferably formed by a coating process and more preferably a spin-coating process.

As shown in FIG. 2, the transfer layer 140 is formed on the separation layer 120. The transfer layer 140 includes the base insulating sublayer 142 and a thin-film device sublayer 144. The base insulating sublayer 142 abuts on the separation layer 120 and may be made of, for example, $SiO_2$ or $Si_3N_4$. The thickness of the base insulating sublayer 142 is determined depending on its purpose and/or function and is preferably about 10 nm to 5 μm and more preferably about 40 nm to 1 μm. The separation layer 120 is formed for various purposes and has at least one of a function of physically or chemically protecting the transfer layer 140, a function of electrically insulating the transfer layer 140, a function of conducting electricity, a function of blocking a laser beam, a function of preventing migration, and a function of reflecting light. In particular, the separation layer 120 has a function of electrically insulating pixel electrodes 151 from display devices, which are therefore supplied with sufficient voltages.

The thin-film device sublayer 144 contains thin-film devices such as thin-film transistors (TFTs) and includes a semiconductor zone made of polysilicon or amorphous silicon, a gate-insulating zone, a gate electrode zone, an interlayer insulating zone, and a source/drain electrode zone.

The pixel electrodes 151 are located at the bottom of the thin-film device sublayer 144. The pixel electrodes 151 are preferably located at the same level as that at which the following zones are located: the semiconductor zone, the gate-insulating zone, the gate electrode zone, the interlayer insulating zone, and the source/drain electrode zone, these zones being used to form TFTs contained in the thin-film device sublayer 144.

The configuration of the thin-film device sublayer 144 and a process for forming the thin-film device sublayer 144 will be described in a second embodiment and third embodiment in detail.

After the pixel electrodes 151 are formed, the semiconductor zone and the interlayer insulating zone, which is made of, for example, $SiO_2$ are formed.

Storage electrodes 152a are then formed on the interlayer insulating zone so as to be opposed to the pixel electrodes 151, whereby storage capacitors CS are formed between the pixel electrodes 151 and the storage electrodes 152a. The storage electrodes 152a are preferably formed from a wiring layer for forming source and drain electrodes forming the TFTs.

The storage electrodes 152a overlap with the pixel electrodes 151 with the interlayer insulating zone disposed therebetween. This is effective in achieving a predetermined aperture ratio and storage capacitance.

Figure 3:
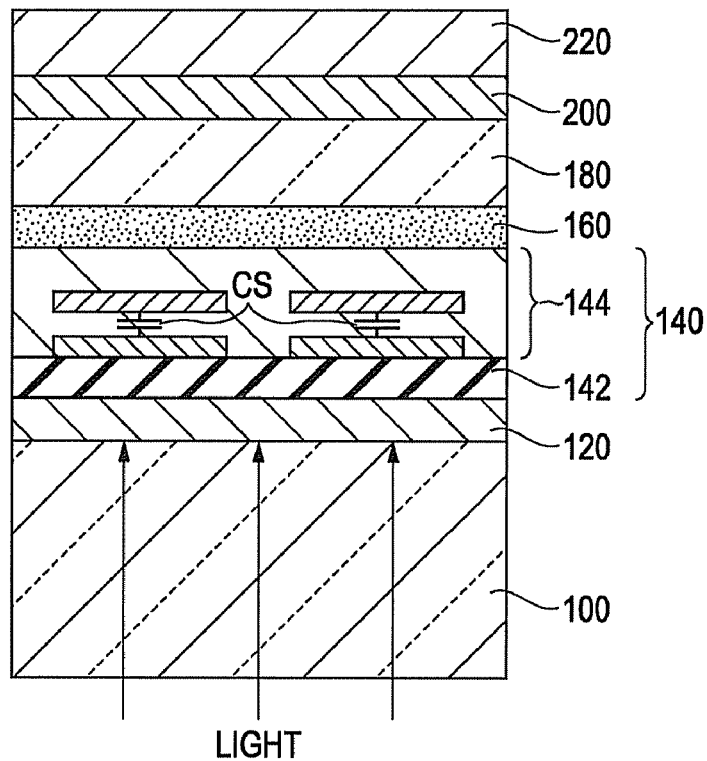
FIG. 3 is a schematic view showing a step of separating the substrate and transfer layer from each other.

As shown in FIG. 3, the thin-film device sublayer 144 is bonded to a light-transmissive transfer body 180 with an adhesive layer 160.

Preferable examples of an adhesive for forming the adhesive layer 160 include curable adhesives such as reaction-curable adhesives, heat-curable adhesives, photocurable adhesives including ultraviolet-curable adhesives, and anaerobically curable adhesives. The adhesive may be of an epoxy type, an acrylate type, a silicone type, or another type. The adhesive layer 160 is preferably formed by a coating process.

For the use of a curable adhesive, the curable adhesive is applied to the transfer layer 140, the transfer body 180 is pressed against the curable adhesive, and the curable adhesive is then cured by a technique suitable therefor, whereby the transfer layer 140 and the transfer body 180 are bonded to or fixed to each other. The term "thin-film device layer" is used herein in place of the transfer layer 140 in some cases.

When the adhesive is photocurable, light is applied to one or both of an outer surface of the substrate 100 and that of the transfer body 180. In order to avoid affecting the thin-film device layer, the adhesive is preferably ultraviolet-curable.

Unlike FIG. 3, the transfer layer 140 and the adhesive layer 160 may be formed on the transfer body 180 in that order. When the transfer body 180 is adhesive, the adhesive layer 160 need not be formed.

The transfer body 180 is not particularly limited and is preferably a transparent substrate, which may be flat or curved. The transfer body 180 may be inferior in heat resistance, corrosion resistance, and/or the like to the substrate 100. This is because the transfer layer 140 is formed on the substrate 100 side and then transferred to the transfer body 180 and therefore the heat resistance of the transfer body 180 does not depend on temperature conditions for forming the transfer layer 140.

Therefore, the following material can be used to form the transfer body 180: a material with a glass transition point (Tg) or softening point less than or equal to Tmax that represents the maximum temperature during the formation of the transfer layer 140. The transfer body 180 is preferably made of a material with a glass transition point (Tg) of 800° C. or less, more preferably 500° C. or less, and further more preferably 320° C. or less.

The transfer body 180 preferably has a certain degree of stiffness or strength and may be flexible or elastic.

Examples of a material for forming the transfer body 180 include synthetic resins and glass materials. In particular, low-cost synthetic resins and ordinary low-cost glass materials with a low melting point.

The synthetic resins may be thermoplastic or thermosetting. Examples of the synthetic resins include polyolefins such as polyethylenes, polypropylenes, ethylene-propylene copolymers, and ethylene-vinyl acetate (EVA) copolymers; cyclic polyolefins; modified polyolefins; polyvinyl chlorides; polyvinylidene chlorides; polystyrenes; polyamides; polyimides; polyamidoimides; polycarbonates; poly(4-methylpentene-1); polyionomers; acrylic resins; polymethylmethacrylates; acrylonitrile-styrene copolymers (AS resins); butadiene-styrene copolymers; polyol copolymers (EVOHs); polyesters such as polyethylene terephthalates (PETs), polybutylene terephthalates (PBTs), and polycyclohexane terephthalates (PCTs); polyethers; polyether ketones (PEKs); polyether ether ketone (PEEK®); polyether imides; polyacetals (POMs); polyphenylene oxides; modified polyphenylene oxides; polyarylates; aromatic polyesters (liquid crystals); fluororesins such as polytetrafluoroethylenes and polyvinylidene fluorides; thermoplastic elastomers such as styrenic elastomers, polyolefin elastomers, polyvinyl chloride elastomers, polyurethane elastomers, fluororubber elastomers, and polyethylene chloride elastomers; epoxy resins; phenol resins; urea resins; melamine resins; unsaturated polyesters; silicone resins; polyurethanes; copolymers of some of these resins and polymers; blends principally containing at least one of these resins and polymers; and polymer alloys principally containing at least one of these resins and polymers. These resins and polymers may be used alone or in combination (for example, in the form of a laminate including two or more layers).

Examples of the glass materials include silicate glass (quartz glass), alkali silicate glass, soda-lime glass, potash-lime glass, lead glass (alkali glass), barium glass, and borosilicate glass. Those other than silicate glass are preferable because those have a melting point lower than that of silicate glass, are easier to shape and/or process as compared to silicate glass, and are inexpensive. When the transfer body 180 is made of one of the synthetic resins, the following advantages can be achieved: the transfer body 180 can be formed as one piece if the transfer body 180 has a large size, the transfer body 180 can be readily formed if the transfer body 180 has a complicated shape such as a curved shape or an irregular shape, and the material cost and manufacturing cost of the transfer body 180 are low. The use of such a synthetic resin is effective in manufacturing large-size devices (for example, liquid crystal displays) at low cost.

The transfer body 180 may be used to manufacture independent devices such as liquid crystal cells or used to form a device component such as color filter, an electrode layer, a dielectric layer, an insulating layer, or a semiconductor component.

The transfer body 180 may be made of metal, ceramic, stone, wood, or paper and may be formed on an arbitrary article such as a clock, an air conditioner, or a printed circuit board or a structure such as a wall, a pillar, a ceiling, or a windowpane.

In this embodiment, the transfer body 180 bonded to the transfer layer 140 is further bonded to a support substrate 220 with a temporary adhesive layer 200 sandwiched therebetween. The transfer body 180 need not necessarily be bonded to the support substrate 220. However, when the transfer body 180 is made of one of the above synthetic resins, the transfer body 180 bonded to the transfer layer 140 is difficult to process or handle. Therefore, the transfer body 180 is preferably bonded to a support substrate 220.

When the temporary adhesive layer 200 is degradable by, for example, ultraviolet light, the transfer body 180 can be readily separated from the support substrate 220 by irradiating the temporary adhesive layer 200 with ultraviolet light through the support substrate 220. The temporary adhesive layer 200 may be degradable by heat instead of ultraviolet light. The support substrate 220 is preferably made of a glass material, a synthetic resin, a metal material, or the like and preferably has a thickness of 0.5 mm or more. In order to separate the support substrate 220 from the transfer body 180 using ultraviolet light or heat, the support substrate 220 is preferably made of a material with high ultraviolet transmittance or heat conductivity, respectively.

As shown in FIG. 3, the substrate 100 is irradiated with light. The light applied to the substrate 100 passes through the substrate 100 to reach the separation layer 120. This causes intralayer delamination and/or interfacial delamination in the separation layer 120 to reduce or eliminate the bonding force of the separation layer 120.

Principles causing intralayer delamination and/or interfacial delamination in the separation layer 120 are probably the ablation of a material for forming the separation layer 120, the release of gas contained in the separation layer 120, and the phase transition of the separation layer 120, which is melted or vaporized by the irradiation with light. The term "ablation" used herein means that a fixing material (the material for forming the separation layer 120) absorbs light to chemically or physically excite and therefore bonds between atoms or molecules present in a surface or internal portion of the fixing material are cleaved and refers to a phenomenon that the material for forming the separation layer 120 is partially or entirely is melted or vaporized (evaporated). Fine bubbles are formed during the phase transition thereof, whereby the bonding force of the separation layer 120 may be reduced.

Whether the separation layer 120 suffers from one or both of intralayer delamination and interfacial delamination depends on the composition of the separation layer 120; various factors such as the type, wavelength, intensity, permeability of the light applied to the separation layer 120; and the like.

The light applied to the separation layer 120 is not particularly limited and preferably causes intralayer delamination and/or interfacial delamination in the separation layer 120. Examples of the light applied thereto include X-rays, ultraviolet rays, visible light, infrared rays (heat rays), laser beams, millimeter waves, microwaves, electron beams, and radiations such as $\alpha$-rays, $\beta$-rays, $\gamma$-rays. In particular, the laser beams are preferable because the laser beams are effective in causing the ablation of the separation layer 120.

Preferable examples of a laser for generating a beam applied to the separation layer 120 include gas lasers such as excimer lasers, Ar lasers, $CO_2$ lasers, CO lasers, and He—Ne lasers and solid (semiconductor) lasers such as Nd-YAG lasers. In particular, an excimer laser is preferably used.

The excimer laser emits a high energy beam with a short wavelength and therefore is effective in causing the ablation of the separation layer 120 in an extremely short time. Thus, the separation layer 120 can be ablated without increasing the temperature of the transfer layer 140 and substrate 100 next to the separation layer 120, that is, without degrading or damaging the transfer layer 140 and the substrate 100.

In order to ablate the separation layer 120, a laser beam applied to the separation layer 120 preferably has a wavelength of about 100 to 350 nm when the ablation of the separation layer 120 depends on the wavelength of light.

In order to cause the separation layer 120 to discharge gas, to be vaporized, or to be sublimated, the laser beam applied thereto preferably has a wavelength of about 350 to 1,200 nm.

For the use of the excimer laser, the laser beam applied thereto preferably has an energy density of about 10 to 5,000 mJ/cm$^2$ and more preferably 100 to 500 mJ/cm$^2$. The irradiation time of the separation layer 120 is preferably about 1 to 1,000 ns and more preferably 10 to 100 ns. When the energy density of the laser beam is low or the irradiation time of the separation layer 120 is short, the separation layer 120 is not sufficiently ablated. When the energy density of the laser beam is extremely high or the irradiation time of the separation layer 120 is extremely long, the laser beam may pass through the separation layer 120 to damage the transfer layer 140.

The separation layer 120 is preferably uniformly irradiated with light, for example, the laser beam. Light may be applied perpendicularly to the separation layer 120 or applied thereto in a direction inclined at a predetermined angle.

If the area of the separation layer 120 is greater than the area irradiated with light in one operation, the separation layer 120 may be globally irradiated with light in several operations. A portion of the separation layer 120 may be irradiated with light two or more times. Different types of light rays or light beams (layer beams) with different wavelengths may be applied to one region or different regions of the separation layer 120 two or more times.

Figure 4:
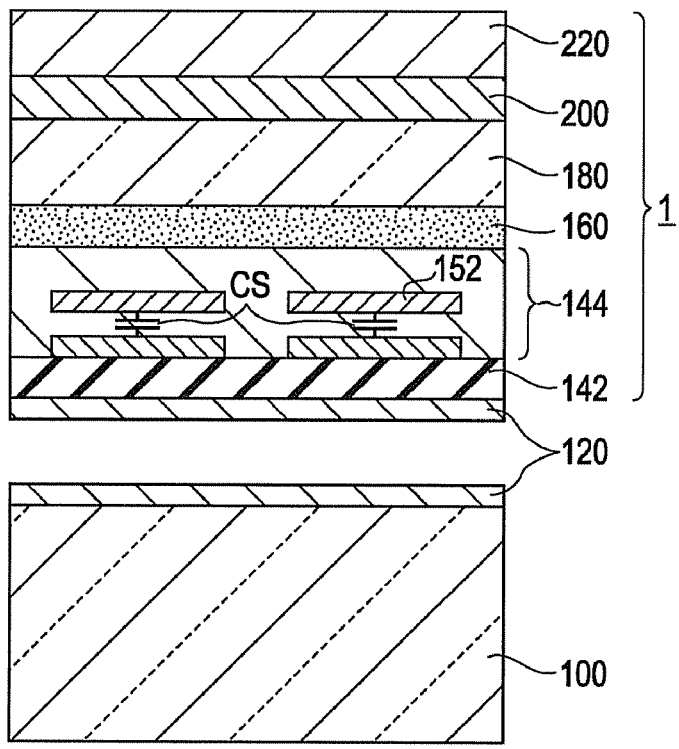
FIG. 4 is a schematic view showing the substrate and transfer layer separated from each other.

As shown in FIG. 4, the substrate 100 is removed from the separation layer 120. In this operation, portions of the separation layer 120 may remain on the substrate 100. The remaining portions of the separation layer 120 are removed from the substrate 100 by washing, etching, ashing, grinding, or a combination of these techniques. This allows the transfer layer 140 to be transferred to the transfer body 180.

A thin-film device 1 is manufactured through the above steps.

Figure 5:
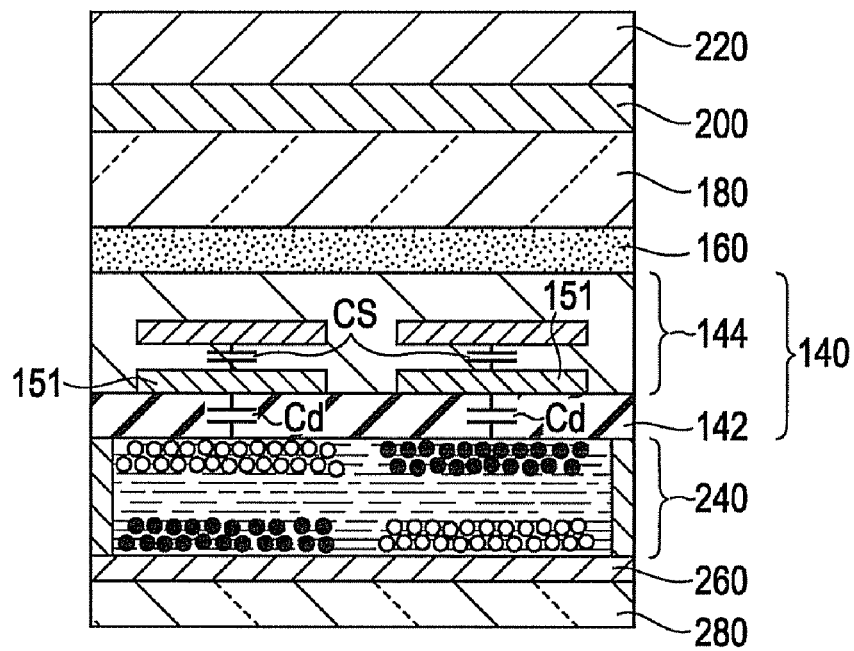
FIG. 5 is a sectional view showing a step of bonding the transfer layer to an electrophoretic display device layer.
Figure 6:
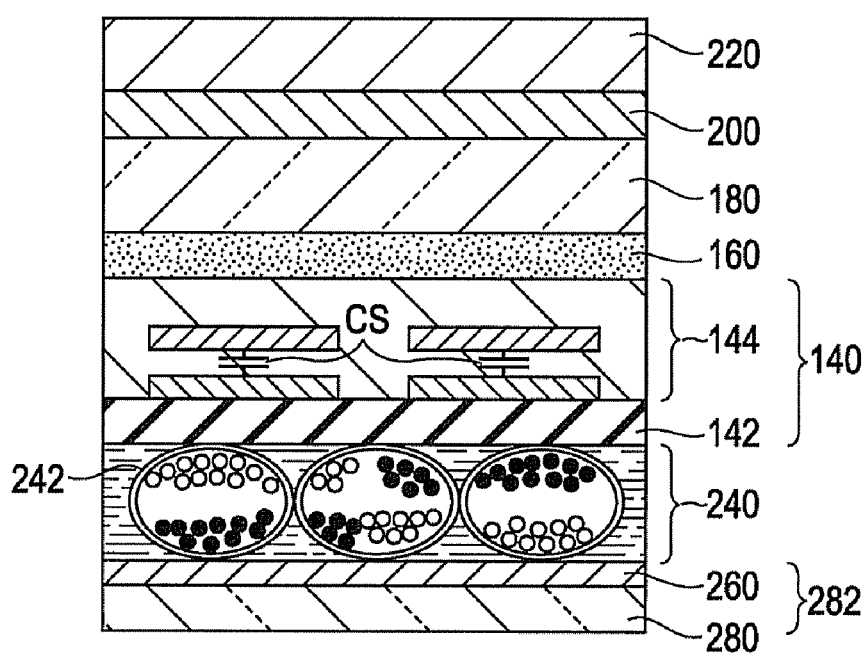
FIG. 6 is a sectional view showing a step of bonding the transfer layer to an electrophoretic display device layer containing microcapsules.
Figure 7:
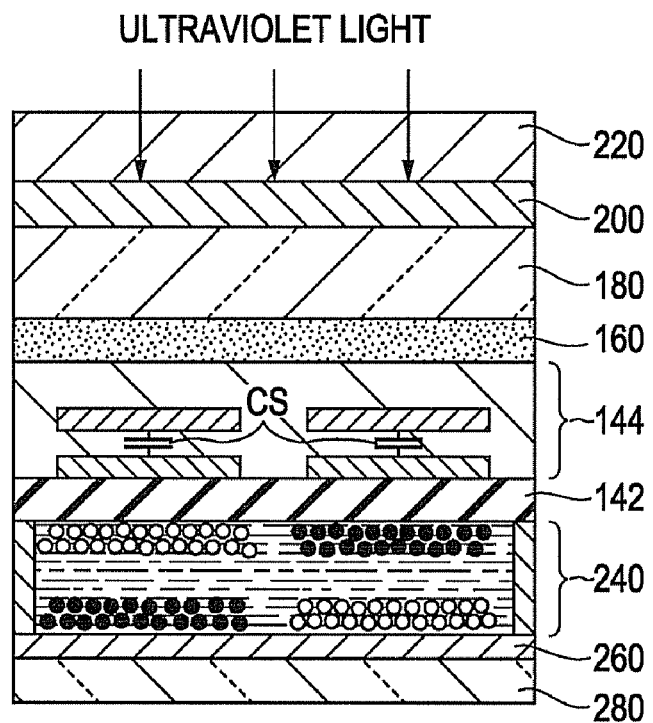
FIG. 7 is a schematic view showing a step of separating the transfer layer from a support substrate.

As shown in FIG. 5, a display device layer 240, a common electrode 260, and a counter substrate 280 are formed on the base insulating sublayer 142 in that order. The base insulating sublayer 142 is sandwiched between the display device layer 240 and the pixel electrodes 151, which are located at the bottom of the transfer layer 140. This allows capacitors (dielectric capacitors) Cd to be formed between the display device layer 240 and the pixel electrodes 151. Therefore, the display device layer 240 and the pixel electrodes 151 can be well insulated from each other. This is effective in reducing the leakage current flowing into the display device layer 240. That is, this leads to an increase in display performance and a reduction in power consumption.

The following equation holds for the display device layer 240:

$$Vep = V \cdot Cd/(Cep+Cd)$$

wherein Vep represents the driving voltage applied to a portion of the display device layer 240 that corresponds to each pixel, V represents the voltage applied between the common electrode 260 and each pixel electrode 151, Cd represents the capacitance of each capacitor Cd, and Cep represents the capacitance of the pixel-corresponding portion of the display device layer 240. This equation indicates that the capacitance of the capacitor Cd needs to be sufficiently greater than the capacitance Cep of the pixel-corresponding portion in order to apply a sufficient driving voltage to the display device layer 240. When the thickness of the base insulating sublayer 142 is sufficiently less than that of the display device layer 240, the capacitance of the capacitor Cd is sufficiently greater than the capacitance Cep of the pixel-corresponding portion. The thickness of the base insulating sublayer 142 is preferably one tenth or less of that of the display device layer 240. In particular, the base insulating sublayer 142 preferably has a sufficiently small thickness of about 10 nm to 5 μm when being made of SiO$_2$. This allows the display device layer 240 to be supplied with a sufficient driving voltage and also allows the pixel electrodes 151 and the display device layer 240 to be well insulated from each other. Since the dielectric constant of SiO$_2$, which may be used to form the base insulating sublayer 142, is about four, Si$_3$N$_4$, which has a dielectric constant of about seven, may be used to form the base insulating sublayer 142. This allows the pixel electrodes 151 and the display device layer 240 to be better insulated from each other.

The display device layer 240 may include voltage-driven display devices such as electrophoretic devices or liquid crystal devices. The common electrode 260 may be a transparent conductive layer, such as an ITO layer, allowing visible light to pass therethrough. When display device layer 240 includes current-driven display devices such as organic electroluminescent (EL) devices or current-driven electrophoretic devices, the base insulating sublayer 142 may be removed in advance of the formation of the display device layer 240 such that the pixel electrodes 151 are exposed. The pixel electrodes 151 can be exposed by etching, ashing, grinding, or the like. Alternatively, photolithography may be used to expose only the pixel electrodes 151.

The display device layer 240, the common electrode 260, and the counter substrate 280 need not be formed in that order. The following sheet may be attached to the transfer body 180: a sheet prepared in such a manner that the display device layer 240, the common electrode 260, and the counter substrate 280 are stacked on a resin substrate such as a PET film. For example, a PET film 282 shown in FIG. 6 may be attached to the transfer layer 140 removed from the substrate 100. The PET film 282 is laminated with an ITO film and is coated with microcapsules 242 containing an electrophoretic material.

When the transfer body 180 is integrated with the support substrate 220, the transfer body 180 is preferably removed from the support substrate 220 together with the transfer layer 140 in such a manner that the temporary adhesive layer 200 is broken or degraded. When the temporary adhesive layer 200 is ablated by ultraviolet light, the transfer body 180 can be removed from the support substrate 220 by applying ultraviolet light to the support substrate 220.

Figure 8:
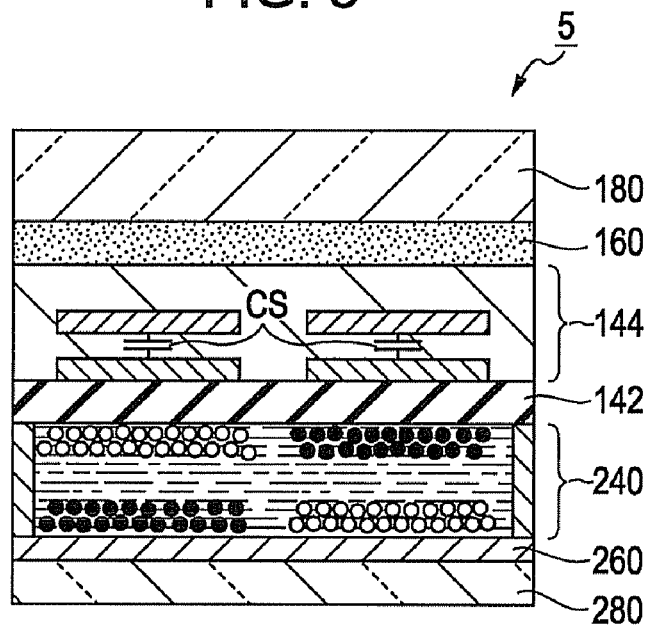
FIG. 8 is a sectional view of a display manufactured by a method according to a first embodiment of the present invention.

Through the above steps, a display 5 having a configuration shown in FIG. 8 is manufactured. According to the transfer method of this embodiment, the thin-film device 1 formed above the substrate 100, which is the original, can be transferred to the transfer body 180 in one step, whereby the display 5 can be formed on the transfer body 180.

Therefore, the following method can be provided: a method, including a transfer step, for manufacturing a thin-film device effective in securing a high aperture ratio and high storage capacitance.

Second Embodiment

An electrophoretic display according to a second embodiment of the present invention will now be described. A method for manufacturing the electrophoretic display is also described below. In the method, a pixel circuit and peripheral circuit included in the electrophoretic display are formed on a substrate and then transferred to a transfer body.

In this embodiment, a thin-film device layer including the pixel circuit and the peripheral circuit is described in greater detail as compared to that described in the first embodiment.

The same components as those described in the first embodiment are denoted by the same reference numerals as those used in the first embodiment and will not be described in detail.

Figure 9:
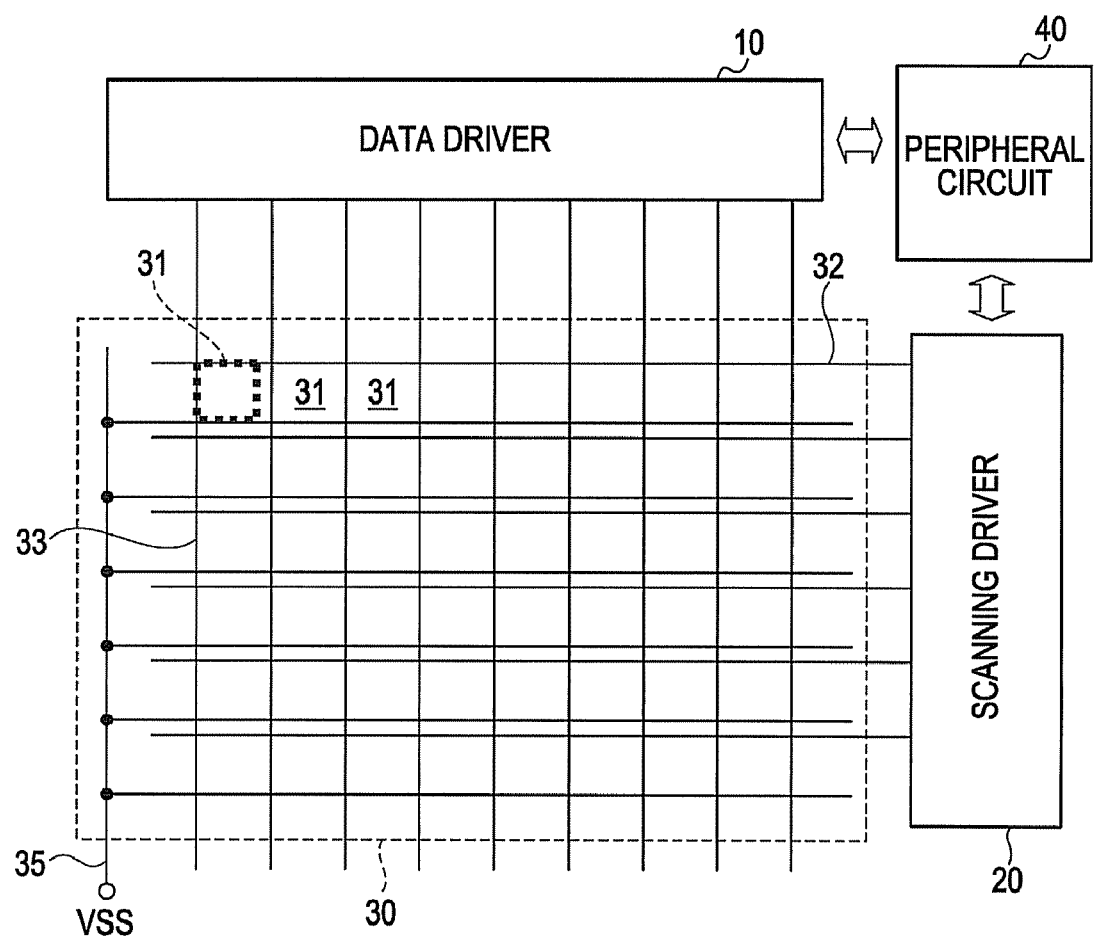
FIG. 9 is a block diagram of an electrophoretic display according to a second embodiment of the present invention.

The configuration of the electrophoretic display will now be described. FIG. 9 is a block diagram of the electrophoretic display. With reference to FIG. 9, the electrophoretic display includes a plurality of scanning lines 32, a scanning driver 20 for sequentially selecting the scanning lines 32, a plurality of data lines 33 intersecting with the scanning lines 32, a data driver 10 for sequentially selecting the data lines 33, active matrix sections 30 which are located near intersections of the scanning lines 32 and the data lines 33 and which each include one of pixel circuits 31 arranged in an matrix pattern, and a peripheral circuit 40 for controlling the data driver 10 and the scanning driver 20.

In this embodiment, at least one of the scanning driver 20, the data driver 10, the active matrix sections 30, and the peripheral circuit 40 includes the thin-film device 1 according to the first embodiment. That is, all of the data driver 10, the scanning driver 20, the active matrix sections 30, and the peripheral circuit 40 may include thin-film devices having the same configuration as that of the thin-film device 1. Alternatively, parts formed on a transfer body 180 may be combined with each other by wiring. Only the active matrix sections 30 may include the thin-film devices as the thin-film device 1 and the data driver 10 and the scanning driver 20 may include ICs.

In descriptions below, the data driver 10, the scanning driver 20, the peripheral circuit 40 are collectively referred to as peripheral circuits.

Figure 10:
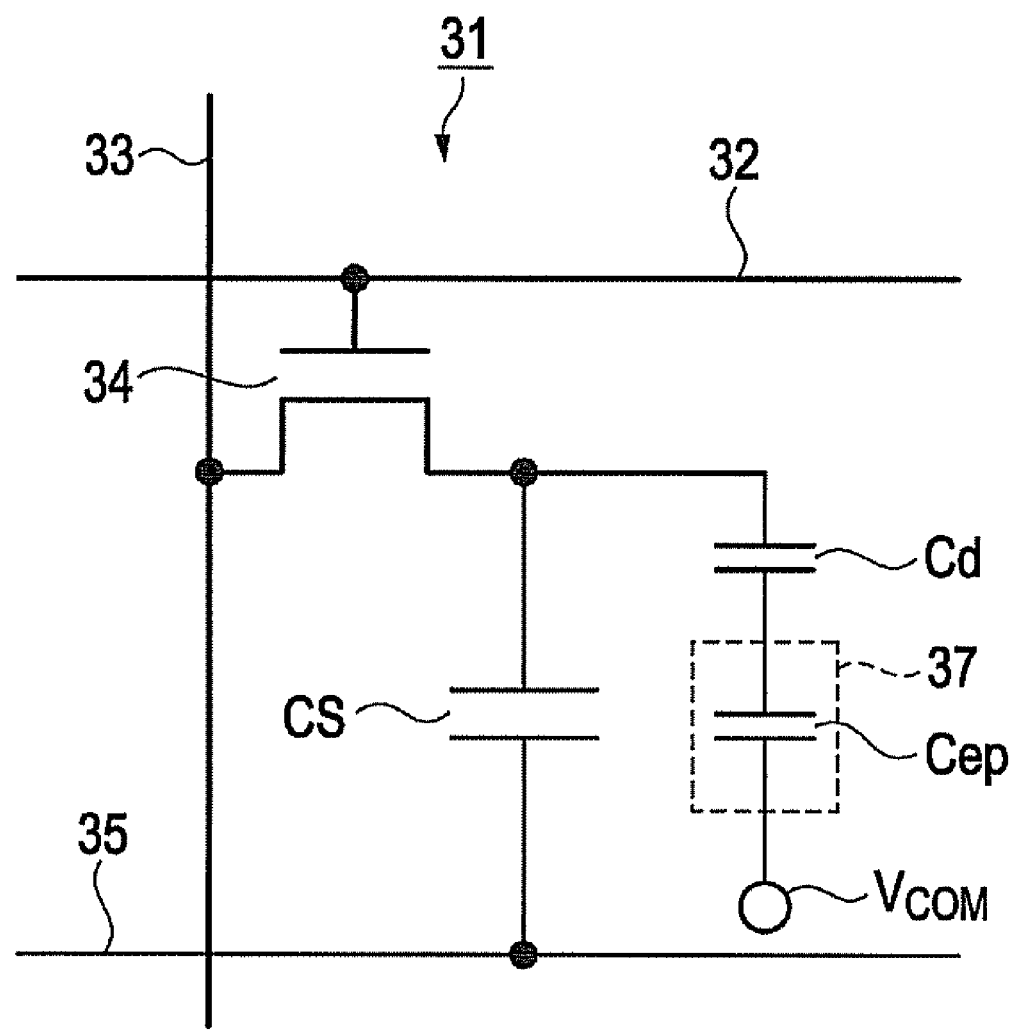
FIG. 10 is a diagram of a pixel circuit included in the electrophoretic display.

FIG. 10 is a diagram of one of the pixel circuits 31. With reference to FIG. 10, the pixel circuits 31 each include an electrophoretic device 3; a storage capacitor CS for holding the electric polarization of the electrophoretic device 37; a selection transistor 34 having a switching function for storing a charge in the storage capacitor CS; and a dielectric capacitor Cd, connected to the electrophoretic device 37 in parallel, for preventing a leakage current. The selection transistor 34 includes a gate connected to one of the scanning lines 32, a source connected to one of the data lines 33, and a drain connected to one end of the electrophoretic device 37 and one end of the storage capacitor CS. The other end of the storage capacitor CS is connected to a low-voltage line 35.

In descriptions below, the selection transistors 34 and TFTs included in the peripheral circuits are collectively referred to as TFTs.

The method for manufacturing the electrophoretic display will now be described. The manufacturing method includes a step of forming a circuit, including CMOS TFTs, for driving the electrophoretic display on a substrate and a step of transferring the driving circuit to a transfer body.

Step 1

Figure 11:
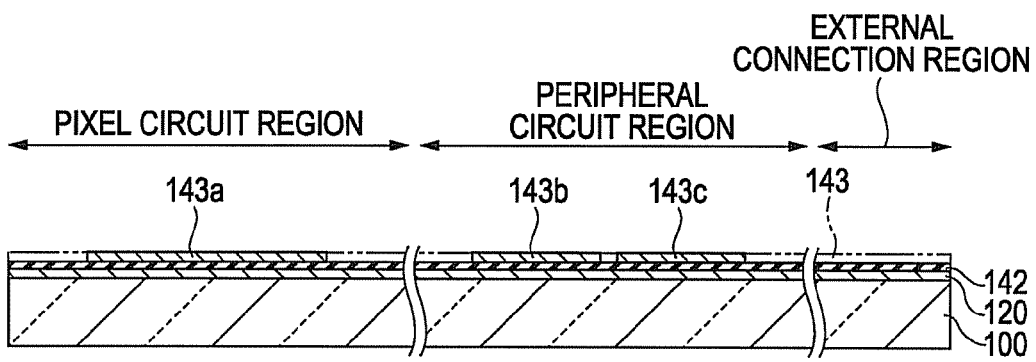
FIG. 11 is a sectional view showing a step of forming a separation layer, a base insulating layer, and gate insulating layer on a substrate included in the electrophoretic display.

FIG. 11 shows a pixel circuit region, a peripheral circuit region, and an external connection region. The pixel circuit region is one for forming the selection transistors 34, the storage capacitors CS (see FIG. 10), and pixel electrodes. The peripheral circuit region is one for forming driving circuits such as the data driver 10 and the scanning driver 20, the peripheral circuit 40 (see FIG. 9), and a protective circuit. The external connection region is one for forming external connection terminals. The terms "pixel circuit region", "peripheral circuit region", and "external connection region" are not shown in FIGS. 12 to 20; however, the manufacturing method is described below on the assumption that these figures, as well as FIG. 11, show the pixel circuit region, the peripheral circuit region, and the external connection region.

As shown in FIG. 11, the following layers are deposited on a substrate 100 made of, for example, quartz in this order: a separation layer 120 formed from, for example, amorphous silicon by an LPCVD process; a base insulating layer 142 made of, for example, $SiO_2$; and an amorphous silicon layer formed by, for example, an LPCVD process. The amorphous silicon layer is globally irradiated with a laser beam, whereby the amorphous silicon layer is annealed. This allows the amorphous silicon layer to be crystallized into a polysilicon layer 143. The polysilicon layer 143 is patterned into first polysilicon islands 143a, second polysilicon islands 143b, and third polysilicon islands 143c. The first polysilicon islands 143a are finally processed into pixel electrodes.

Step 2

Figure 12:
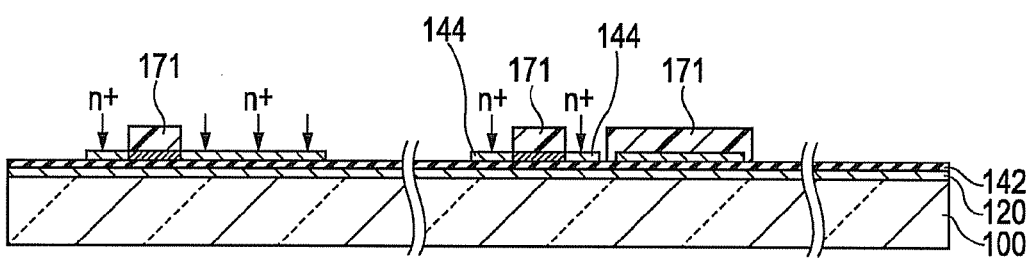
FIG. 12 is a sectional view showing a step of implanting phosphorus ions into regions for forming n-type TFTs and regions for forming capacitors included in the electrophoretic display.

As shown in FIG. 12, for example, phosphorus (P) ions are heavily implanted into regions for forming n-type TFTs and regions for forming capacitors, whereby heavily doped $n^+$-type source/drain regions are formed. In this operation, regions for forming p-type TFTs are covered with a first mask layer 171 made of polyimide or the like and regions (LDD regions) for forming lightly doped $n^-$-type source/drain regions are also covered with the first mask layer 171 such that the n-type TFTs have a LDD structure. This results in the formation of $n^+$-layers 144.

Step 3

Figure 13:
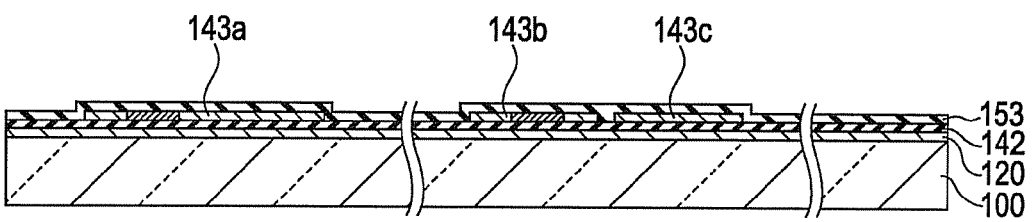
FIG. 13 is a sectional view showing a step of forming a gate insulating layer included in the electrophoretic display.

As shown in FIG. 13, a gate insulating layer 153 are formed over the first, second, and third polysilicon islands 143a, 143b, and 143c by, for example, a CVD process.

Step 4

Figure 14:
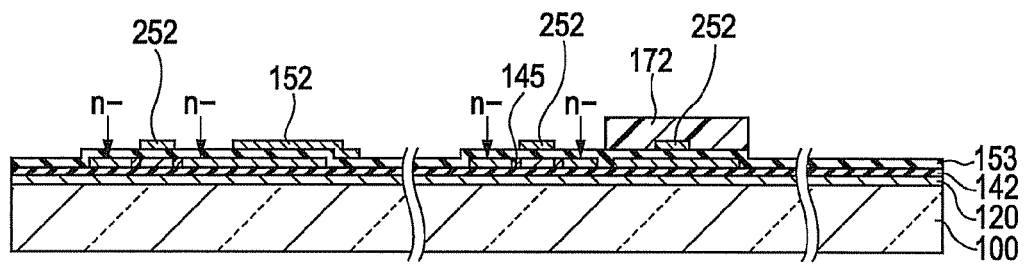
FIG. 14 is a sectional view showing a step of forming gate electrodes included in the electrophoretic display.

As shown in FIG. 14, gate electrodes 252 made of polysilicon, metal, or the like are formed on portions of the gate insulating layer 153 that are located in the pixel circuit region or the peripheral circuit region. In this step, capacitor electrodes 152 are formed on the gate insulating layer 153 such that the capacitor electrodes 152 are connected to the low-voltage line 35 shown in FIG. 10 and overlap with the first polysilicon islands 143a (pixel electrodes).

For example, phosphorus ions are lightly implanted into the regions for forming the lightly doped $n^-$-type source/drain regions, whereby the lightly doped $n^-$-type source/drain regions are formed in a self-aligned manner. With reference to FIG. 14, the regions for the forming p-type TFTs are covered with a second mask layer 172. However, the second mask layer 172 need not necessarily used because heavily doped $p^+$-regions are formed in the next step.

Step 5

Figure 15:
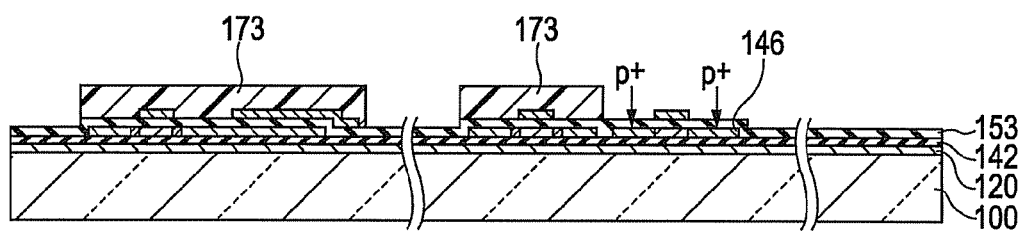
FIG. 15 is a sectional view showing a step of forming $p^+$-layers included in the electrophoretic display.

As shown in FIG. 15, a third mask layer 173 made of polyimide or the like is formed so as to cover the gate electrodes 252. For example, boron (B) ions are then implanted into regions exposed from the third mask layer 173, whereby $p^+$-layers 146 are formed in a self-aligned manner.

Step 6

Figure 16:
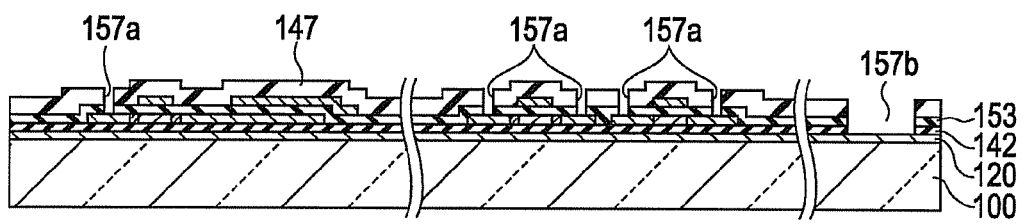
FIG. 16 is a sectional view showing a step of forming contact holes present in the electrophoretic display.

As shown in FIG. 16, an interlayer insulating layer 147 is formed and contact holes 157a and external connection openings 157b are selectively formed in the interlayer insulating layer 147 by etching. In regions for forming the contact holes 157a, the interlayer insulating layer 147 and the gate insulating layer 153 are selectively etched; hence, the contact holes 157a extend through the interlayer insulating layer 147 and the gate insulating layer 153 to the first and second polysilicon islands 143a and 143b. In regions for forming the external connection openings 157b, the interlayer insulating layer 147, the gate insulating layer 153, and the base insulating layer 142 are selectively etched; hence, the external connection openings 157b extend through the interlayer insulating layer 147, the gate insulating layer 153, and the base insulating layer 142 to the separation layer 120.

Step 7

Figure 17:
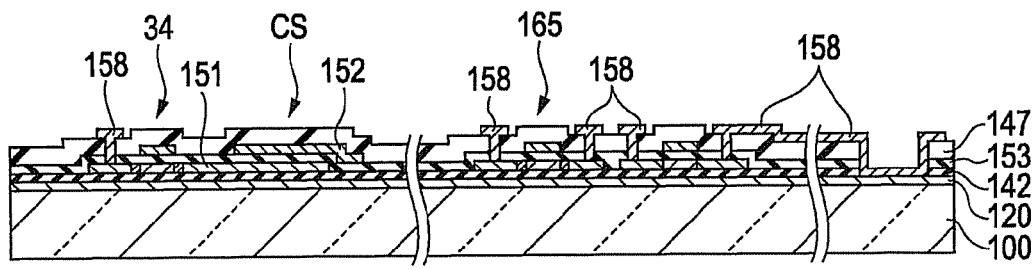
FIG. 17 is a sectional view showing a step of forming source/drain electrodes included in the electrophoretic display.

As shown in FIG. 17, source/drain electrodes 158 are formed in the contact holes 157a and the external connection openings 157b. The source/drain electrodes 158 disposed in the external connection openings 157b extend to the separation layer 120 and are processed into external connection terminals 149 shown in FIG. 20 in a transfer step.

Through the above steps, the selection transistors 34 are formed in the pixel circuit region. The pixel electrodes 151, which are connected to the drains of the selection transistors 34, and the capacitor electrodes 152, which are opposed to the pixel electrodes 151 with the gate insulating layer 153 disposed therebetween, form the storage capacitors CS.

The peripheral circuit region contains a plurality of TFTs 165 formed through the above steps. The selection transistors 34 and the TFTs 165 are top gate-type (staggered) thin-film transistors.

Step 8

Figure 18:
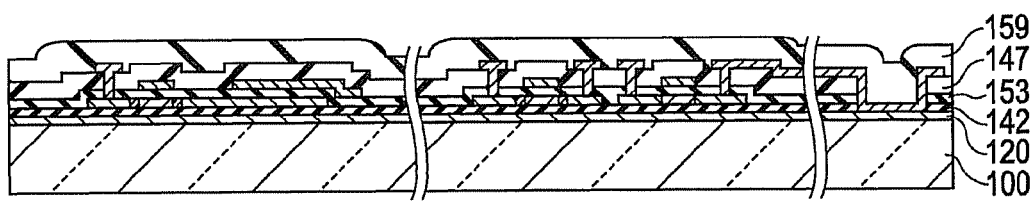
FIG. 18 is a sectional view showing a step of forming a protective layer included in the electrophoretic display.

As shown in FIG. 18, a protective layer 159 serving as a second interlayer insulating layer is formed. The protective layer 159 is preferably made of a material which is highly insulative and which can be readily flattened. The protective layer 159 is preferably formed from $SiO_2$ or $SiN_x$ by CVD or formed from a resin such as an acrylic resin polyimide by spin coating. The protective layer 159 has a function of preventing a TFT layer from being contaminated with ions migrating from an adhesive layer or the like, a function of relieving external stress, and another function. The protective layer 159 need not necessarily be formed.

A layered structure including the TFTs, the external connection terminals, and the base insulating layer 142 to the protective layer 159 corresponds to the transfer layer 140 described in the first embodiment.

Step 9

Figure 19:
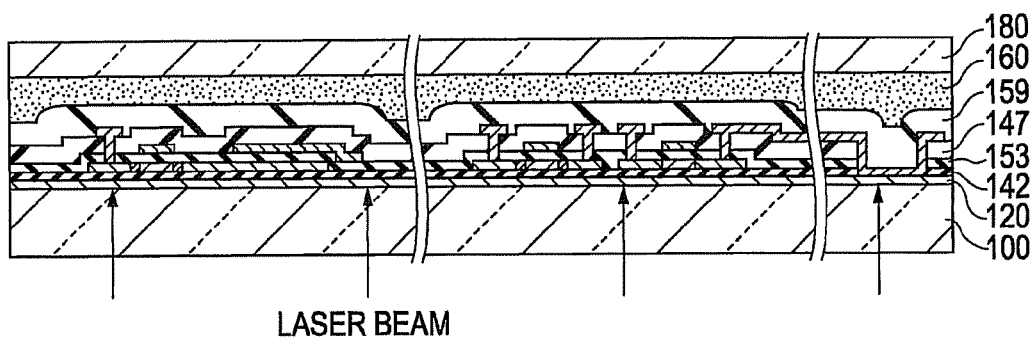
FIG. 19 is a sectional view showing a transfer step included in a method for manufacturing the electrophoretic display.

As shown in FIG. 19, an adhesive layer 160 is formed on the protective layer 159 using an epoxy resin. A transfer body 180 such as a soda glass substrate is attached to the adhesive layer 160. The adhesive layer 160, which is made of the epoxy resin, is cured by heating, whereby the transfer body 180 and the layered structure are bonded to each other.

The adhesive layer 160 may be made of an ultraviolet-curable adhesive such as a photopolymer. In this case, the adhesive layer 160 is cured in such a manner that an ultraviolet ray is applied to the adhesive layer 160 through the transfer body 180 instead of heat.

Step 10

As shown in FIG. 19, the substrate 100 is irradiated with, for example, a Xe—Cl excimer laser beam. This causes intralayer delamination and/or interfacial delamination in the separation layer 120.

Step 11

Figure 20:
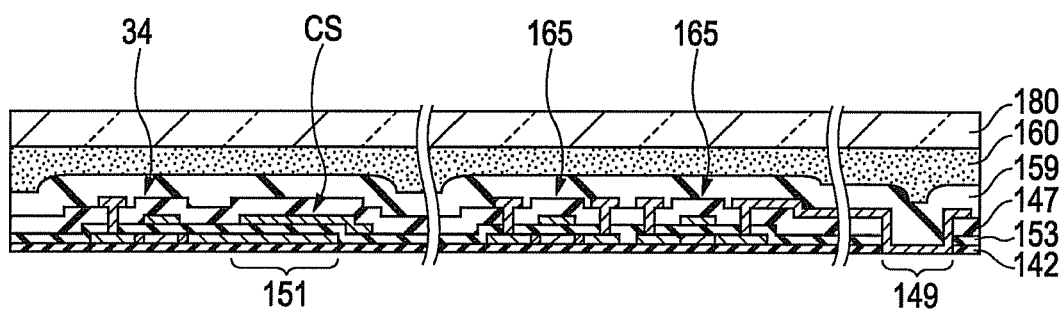
FIG. 20 is a sectional view showing a step of separating the substrate from the separation layer shown in FIG. 11.

As shown in FIG. 20, the substrate 100 is separated from the separation layer 120 and the separation layer 120 is removed from the base insulating layer 142 by etching. This allows the TFTs, which have a CMOS structure, to be transferred to the transfer body 180. In this operation, the external connection terminals 149 are exposed from the base insulating layer 142, which is outermost one. The pixel electrodes 151, which are made of polysilicon, are overlaid with the base insulating layer 142.

A layered structure, shown in FIG. 20, including the TFTs, the external connection terminals, and the base insulating layer 142 to the protective layer 159 corresponds to the thin-film device sublayer 144 described in the first embodiment.

Step 12

Figure 21:
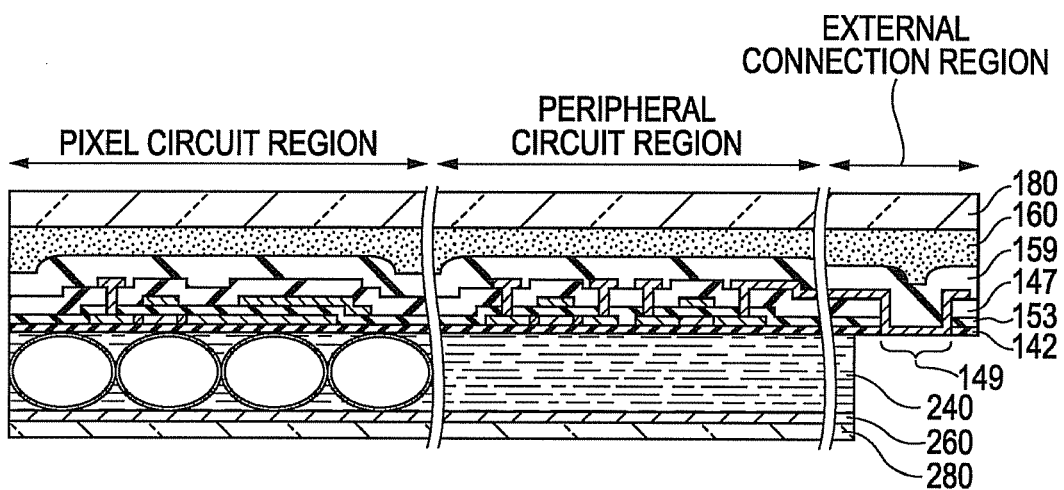
FIG. 21 is a sectional view of the electrophoretic display.

As shown in FIG. 21, a display device layer (electrophoretic display device layer) 240 is finally provided on the base insulating layer 142.

According to the second embodiment, one of a pair of electrodes of each storage capacitor CS is one of the pixel electrodes 151; hence, the storage capacitors CS have high capacitance and are suitable for high-definition pixels, that is, the storage capacitors CS are effective in displaying a high-quality image. Since the capacitor electrodes 152 and the pixel electrodes 151 overlap with each other with the gate insulating layer 153 disposed therebetween, the pixel electrodes 151 need not have a reduced size and therefore the storage capacitors CS have high capacitance. In other words, the pixel electrodes 151 have a predetermined aperture ratio and the storage capacitors CS have sufficient capacitance.

In a two-step transfer process, electrodes such as external connection terminals and pixel electrodes need to be formed close to an outer surface of a transfer layer (on the adhesive layer 160 side in FIG. 20); hence, a step of forming contact holes and a step of forming such electrodes are subsequent to the formation of the protective layer 159. In this embodiment, the pixel electrodes 151 are formed on the separation layer 120 side; hence, no electrode need to be formed on an outer surface of the protective layer 159. The method of this embodiment is superior to the two-step transfer process in that the number of sub-steps of the transfer layer-forming step and the transfer step is small, which leads to a reduction in cost and a reduction in turn-around time (TAT).

The top gate-type TFTs of this embodiment can be more readily formed so as to have a reduced size as compared to bottom gate-type TFTs described in a third embodiment below and therefore are suitable for high-definition displays and high-integration peripheral circuits.

Third Embodiment

An electrophoretic display according to a third embodiment of the present invention will now be described. The same components as those of the electrophoretic display according to the second embodiment are denoted by the same reference numerals as those used in the second embodiment and will not be described in detail.

The electrophoretic display according to the third embodiment is different from the electrophoretic display according to the second embodiment in that the electrophoretic display according to the third embodiment includes a thin-film device layer including TFTs having a configuration different from that of the TFTs arranged in the thin-film device layer of the electrophoretic display according to the second embodiment. In particular, the thin-film device layer of the electrophoretic display according to the third embodiment includes inverted staggered TFTs.

The electrophoretic display of this embodiment has substantially the same configuration as that of the electrophoretic display of the second embodiment as shown in FIGS. 9 and 10.

A method for manufacturing the electrophoretic display of this embodiment will now be described.

Step 1

Figure 22:
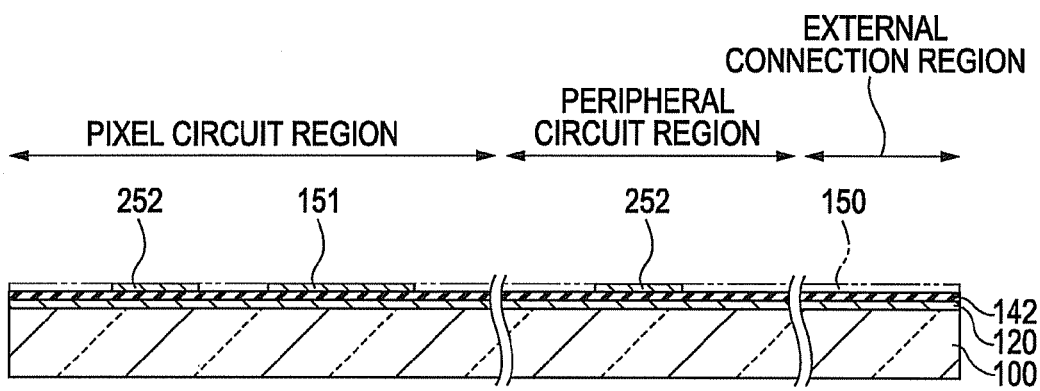
FIG. 22 is a sectional view showing a step of forming a separation layer and a base insulating layer on a substrate included in an electrophoretic display according to a third embodiment of the present invention.

FIG. 22 shows a pixel circuit region for forming selection transistors 34, storage capacitors CS (see FIG. 10), and pixel electrodes 151; a peripheral circuit region for forming driving circuits such as data driver 10 and scanning driver 20, a peripheral circuit 40 (see FIG. 9), and a protective circuit; and an external connection region for forming external connection terminals. The terms "pixel circuit region", "peripheral circuit region", and "external connection region" are not shown in FIGS. 23 to 31; however, the manufacturing method is described below on the assumption that these figures, as well as FIG. 22, show the pixel circuit region, the peripheral circuit region, and the external connection region.

As shown in FIG. 22, the following layers are deposited on a substrate 100 made of, for example, quartz in this order: a separation layer 120 formed from, for example, amorphous silicon by an LPCVD process and a base insulating layer 142 made of, for example, SiO$_2$. A metal thin-film 150 made of tantalum (Ta) or chromium (Cr) is deposited on the base insulating sublayer 142 by a physical vapor deposition process so as to have a thickness of about 100 to 300 nm. The metal thin-film 150 is processed into gate electrodes 252, pixel electrodes 151, and wires by a photolithographic process. In order to minimize the electrical influence of the gate electrodes 252 and wires on a display device layer below, the gate electrodes 252 and the wires preferably have a small width. In particular, the gate electrodes 252 preferably have a width less than or equal to one tenth of that of the pixel electrodes 151. The pixel electrodes 151 preferably have a width of 4 μm or less in plan view.

Step 2

Figure 23:
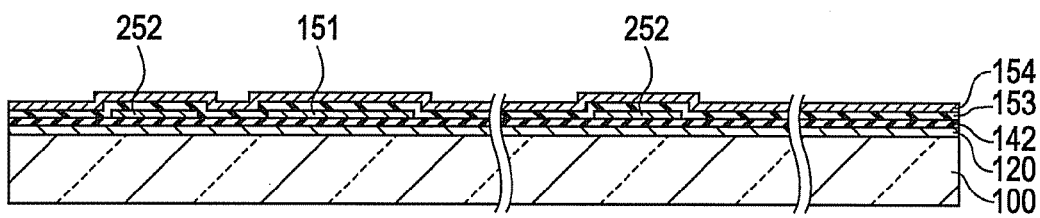
FIG. 23 is a sectional view showing a step of forming a gate insulating layer included in the electrophoretic display according to the third embodiment.

As shown in FIG. 23, a gate insulating layer 153 made of hydrogenated silicon nitride (SiN$_x$) is deposited over the gate electrodes 252 and the pixel electrodes 151 by a plasma-enhanced chemical vapor deposition (PECVD) process using monosilane (SiH$_4$) and ammonia (NH$_3$). The gate insulating layer 153 preferably has a thickness of about 300 nm. An intrinsic amorphous silicon layer 154 is deposited on the gate insulating layer 153 by a PECVD process using monosilane and hydrogen so as to have a thickness of about 50 to 150 nm. The intrinsic amorphous silicon layer 154 is used to form transistor channels.

Step 3

Figure 24:
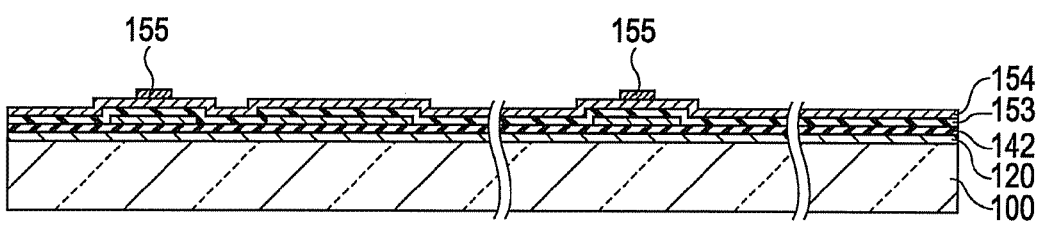
FIG. 24 is a sectional view showing a step of forming an etching stopper layer included in the electrophoretic display according to the third embodiment.

As shown in FIG. 24, an etching stopper layer 155 made of silicon nitride is deposited on the intrinsic amorphous silicon layer 154 and then processed into islands by a photolithographic process such that the islands are located above the gate electrodes 252. The islands are used to protect silicon layer portions for forming channel regions in a step of etching n-type amorphous silicon layer portions for forming source/drain regions and need not necessarily be formed.

Step 4

Figure 25:
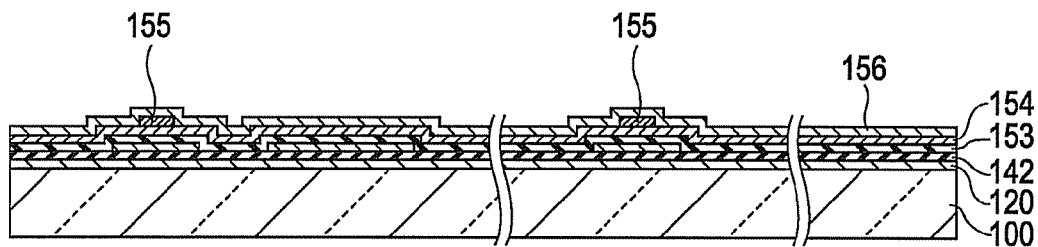
FIG. 25 is a sectional view showing a step of forming an n-type amorphous silicon layer included in the electrophoretic display according to the third embodiment.

As shown in FIG. 25, an n-type amorphous silicon layer 156 with a phosphorus concentration of about $1 \times 10^{20}$ cm$^{-3}$ is deposited over the etching stopper layer 155 and the intrinsic amorphous silicon layer 154 by a PECVD process. The n-type amorphous silicon layer 156 is used to form source/drain regions.

Step 5

Figure 26:
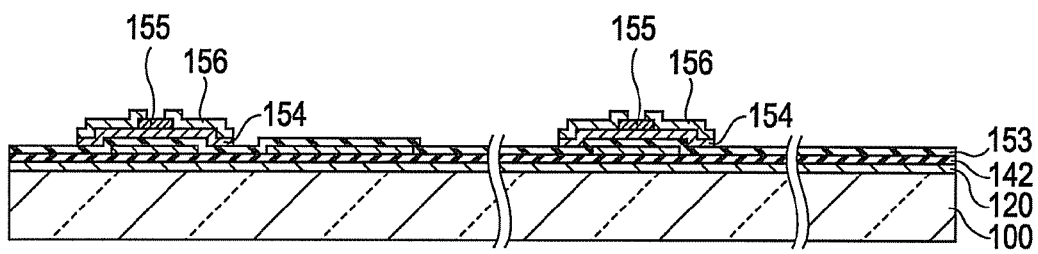
FIG. 26 is a sectional view showing a step of etching the n-type amorphous silicon layer.

As shown in FIG. 26, the intrinsic amorphous silicon layer 154 and the n-type amorphous silicon layer 156 are simultaneously processed into islands for forming TFTs by a photolithographic process.

Step 6

Figure 27:
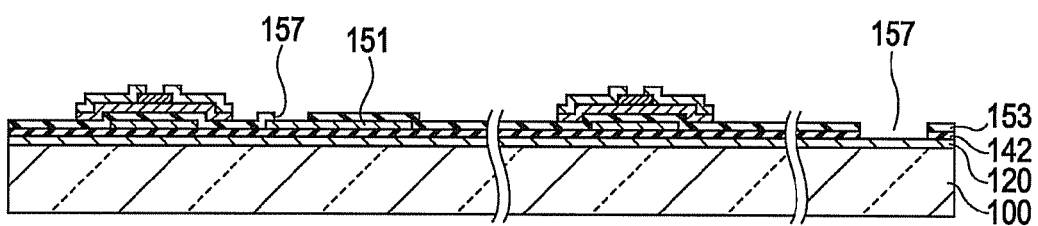
FIG. 27 is a sectional view showing a step of forming contact holes present in the electrophoretic display according to the third embodiment.

As shown in FIG. 27, contact holes 157 are formed in the pixel circuit region and the external connection region. The contact holes 157 are used to connect the pixel electrodes 151 to source/drain electrodes 158 (see FIG. 28) and also used to form external connection terminals 149.

Step 7

Figure 28:
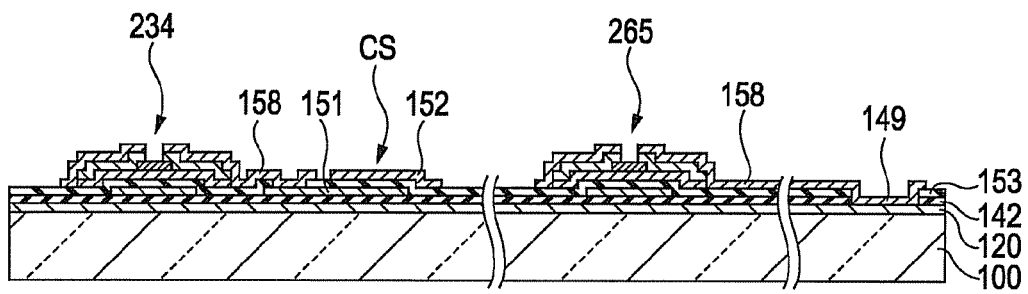
FIG. 28 is a sectional view showing a step of forming a layer for forming source/drain electrodes included in the electrophoretic display according to the third embodiment.

As shown in FIG. 28, a metal material such as aluminum is deposited over the pixel circuit, peripheral circuit, and external connection regions by a sputtering process, whereby a layer for forming the source/drain electrodes 158 is formed. This layer is processed by a photolithographic process, whereby the source/drain electrodes 158, wires, and the external connection terminals 149 are formed. In particular, the external connection terminals 149 are formed in the external connection region so as to contact the separation layer 120. In this step, capacitor electrodes 152 connected to low-voltage line 35 (see FIG. 10) are formed on the gate insulating layer 153 so as to overlap with the pixel electrodes 151.

This allows selection transistors 234 to be formed in the pixel circuit region. The pixel electrodes 151, which are connected to the drains of the selection transistors 234, and the capacitor electrodes 152, which overlap with the pixel electrodes 151 with the gate insulating layer 153 disposed therebetween, form storage capacitors CS.

In this step, a plurality of TFTs 265 are formed in the peripheral circuit region. The selection transistors 234 and the TFTs 265 are bottom gate-type (inverted staggered) thin-film transistors.

Step 8

Figure 29:
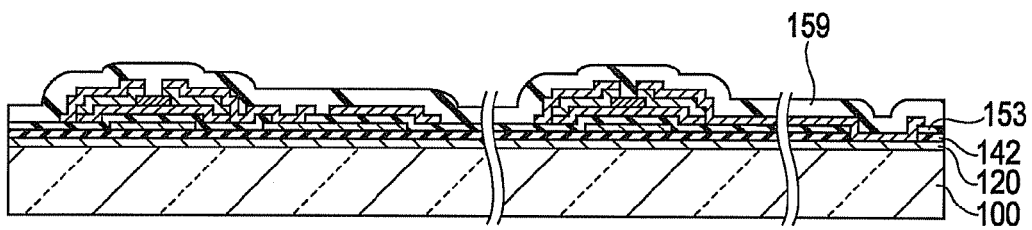
FIG. 29 is a sectional view showing a step of forming a protective layer included in the electrophoretic display according to the third embodiment.

As shown in FIG. 29, hydrogenated silicon nitride is deposited over the pixel circuit, peripheral circuit, and external connection regions by a PECVD process, whereby a protective layer 159 is formed.

A layered structure including the TFTs 265, the external connection terminals 149, and the base insulating layer 142 to the protective layer 159 corresponds to the transfer layer 140 described in the first embodiment.

Step 9

Figure 30:
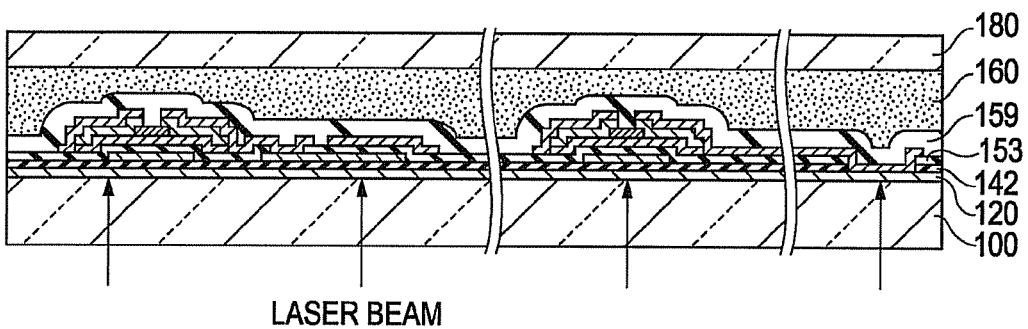
FIG. 30 is a sectional view showing a transfer step included in a method for manufacturing the electrophoretic display according to the third embodiment.
Figure 31:
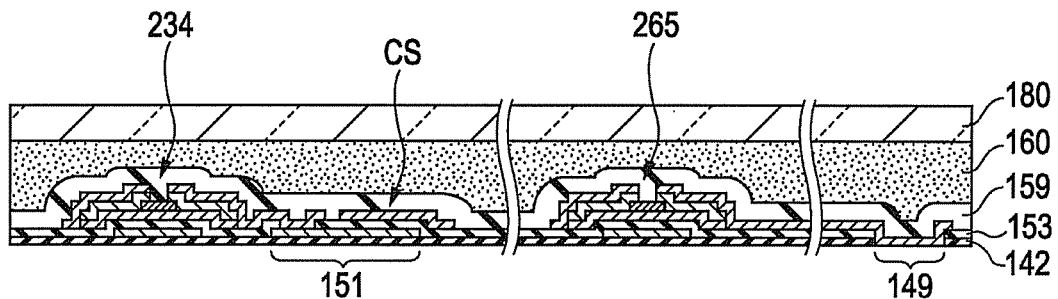
FIG. 31 is a sectional view showing a separation step included in the method according to the third embodiment.

As shown in FIG. 30, an adhesive layer 160 is formed over the protective layer 159 and then attached to a transfer body 180 such as a plastic substrate, whereby the layered structure, that is, a thin-film device layer is bonded to the transfer body 180.

The substrate 100 is irradiated with a laser beam such that ablation occurs at the interface between the substrate 100 and the separation layer 120 and/or the interface between the separation layer 120 and the base insulating layer 142. This allows the thin-film device layer (device layer) to be transferred to the transfer body 180. If pieces of the separation layer 120 remain on the transfer body 180 side, the remaining pieces are removed by dry etching or the like. In this operation, the external connection terminals 149 are exposed from the base insulating layer 142, which is outermost one. The pixel electrodes 151, which are made of the same material as that for forming the gate electrodes 252, are overlaid with the base insulating layer 142.

Step 10

Figure 32:
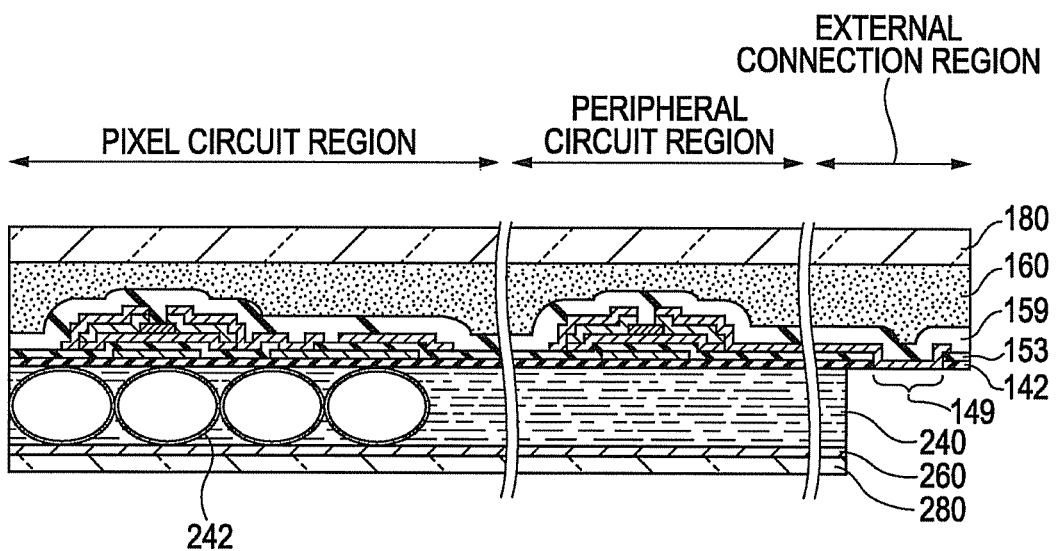
FIG. 32 is a sectional view of the electrophoretic display according to the third embodiment.

As shown in FIG. 32, a display device layer (electrophoretic display device layer) 240 is finally formed on the base insulating sublayer 142.

Figure 33:
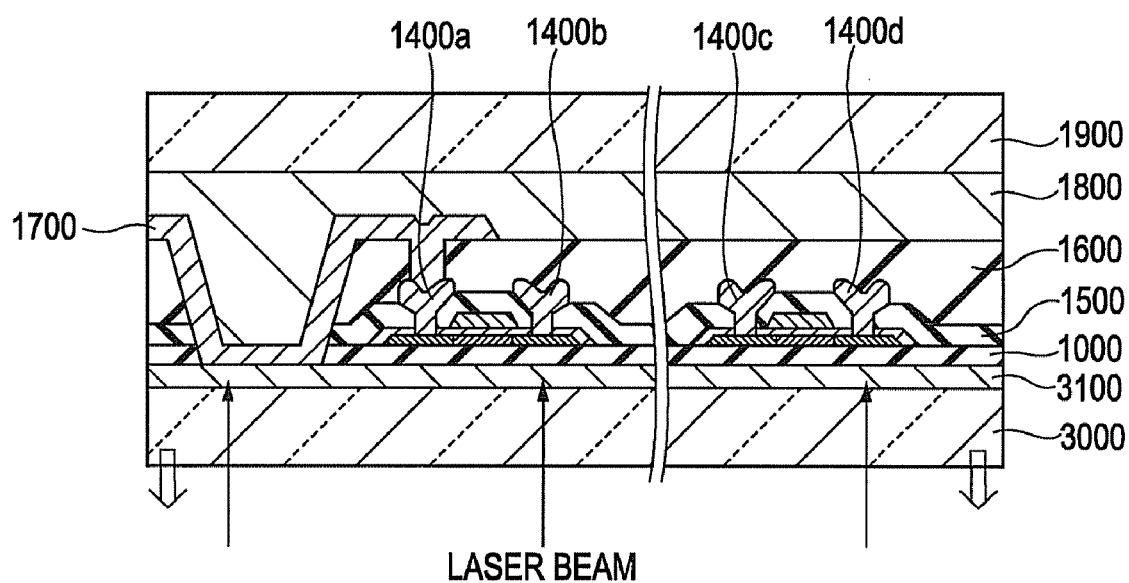
FIG. 33 is a sectional view of a known thin-film device.

Suppose that TFTs have a top gate structure shown in FIG. 33. The TFTs are fabricated by forming the following members on a substrate in this order: a base insulating layer, a semiconductor layer, a gate insulating layer, gate electrodes. Therefore, the semiconductor layer is disposed under the gate electrodes. The substrate is removed from the base insulating layer. A display device layer and a counter electrode are formed on the base insulating layer in that order, whereby a display is manufactured. The base insulating layer, the display device layer, and the counter electrode are arranged in that order when the display device layer is viewed from the drains of the TFTs. If the counter electrode is supplied with a voltage during the operation of the display, back-gate electric fields are applied to the channels of the TFTs. This can cause the TFTs to malfunction.

On the other hand, in the electrophoretic display of this embodiment, the gate electrodes 252 are located between the channels of the TFTs and a counter electrode; hence, the influence of the voltage of the counter electrode on the TFT channels is slight. Therefore, for the use of a one-step transfer process, bottom gate-type TFTs are more preferable than bottom gate-type TFTs, because the influence of the voltage of the counter electrode on TFT operation can be reduced by the formation of the display device layer 240.

For the use of a two-step transfer process, electrodes such as external connection terminals and pixel electrodes need to be formed close to an outer surface of a transfer layer 140 (on the adhesive layer 160 side in FIG. 31); hence, a step of forming contact holes and a step of forming the electrodes are subsequent to the formation of the protective layer 159. In this embodiment, the electrodes on the separation layer 120 side using a gate electrode layer or a source/drain electrode layer; hence, no electrode need to be formed on the outer surface of the transfer layer 140. The method of this embodiment is superior to the two-step transfer process in that the number of steps is small and the transfer layer 140 can be formed at low cost.

Through the steps of fabricating the bottom gate-type TFTs described in this embodiment, the thin-film device layer can be readily formed with a smaller number of masks as compared to that formed through the steps of fabricating the top gate-type TFTs described in the second embodiment.

The entire disclosure of Japanese Patent Application No. 2008-131650, filed May 20, 2008 is expressly incorporated by reference herein.

What is claimed is:

1. A method for manufacturing a thin-film device comprising:
    forming a separation layer on a substrate;
    forming a base insulating layer on the separation layer;
    forming a thin-film device layer on the base insulating layer;
    bonding a transfer layer including the base insulating layer and the thin-film device layer to a transfer body with an adhesive;
    causing intralayer delamination or interfacial delamination in the separation layer; and
    removing the transfer layer from the substrate,
    wherein the thin-film device layer includes a first wiring sublayer which is located at the bottom of the thin-film device layer and which is in contact with the base insulating layer,
    a dielectric sublayer which is in contact with a surface of the first wiring sublayer,
    a semiconductor sublayer electrically insulated from the first wiring sublayer with the dielectric sublayer, and a second wiring sublayer formed subsequently to the semiconductor sublayer,
    the first wiring sublayer includes an electrode located at the bottom of the thin-film device layer,
    the electrode is a pixel electrode,
    the second wiring sublayer includes a capacitor electrode, the capacitor electrode is opposed to the pixel electrode with the dielectric sublayer disposed therebetween, and the whole or a portion of the pixel electrode and the whole or a portion of the capacitor electrode form a capacitor, and
    the thin-film device layer includes a thin-film transistor including a gate electrode that is a portion of the first wiring sublayer, a gate insulating zone that is a portion of the dielectric sublayer, a portion of the semiconductor sublayer, and a source electrode and drain electrode that are portions of the second wiring sublayer and the thin-film transistor has an inverted staggered structure in which the gate electrode, the gate insulating zone, the semiconductor sublayer, and the source and drain electrodes are arranged in that order.

2. A thin-film device manufactured by the method according to claim 1, wherein the gate electrode has a width less than or equal to one tenth of that of the pixel electrode.

* * * * *